(12) United States Patent
Doris et al.

(10) Patent No.: US 7,723,798 B2
(45) Date of Patent: May 25, 2010

(54) LOW POWER CIRCUIT STRUCTURE WITH METAL GATE AND HIGH-K DIELECTRIC

(75) Inventors: Bruce B. Doris, Brewster, NY (US); Eduard Albert Cartier, New York, NY (US); Barry Paul Linder, Hastings-on-Hudson, NY (US); Vijay Narayanan, New York, NY (US); Vamsi Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 11/835,318

(22) Filed: Aug. 7, 2007

(65) Prior Publication Data

US 2009/0039435 A1      Feb. 12, 2009

(51) Int. Cl.
*H01L 27/08* (2006.01)
(52) U.S. Cl. .................. 257/369; 257/E21.062
(58) Field of Classification Search .................. 257/308, 257/368–371, E27.062
See application file for complete search history.

(56) References Cited

U.S. PATENT DOCUMENTS

| | | | |
|---|---|---|---|
| 6,934,182 B2 * | 8/2005 | Chan et al. .................. | 365/154 |
| 6,977,194 B2 | 12/2005 | Belyansky .................. | 438/197 |
| 7,002,209 B2 | 2/2006 | Chen .................. | 257/336 |
| 7,105,394 B2 | 9/2006 | Hachimine .................. | 438/197 |
| 7,115,954 B2 | 10/2006 | Shimizu .................. | 257/369 |
| 7,205,615 B2 | 4/2007 | Tsutsui .................. | 257/369 |
| 7,223,647 B2 | 5/2007 | Hsu .................. | 438/199 |
| 7,317,229 B2 * | 1/2008 | Hung et al. .................. | 257/369 |
| 2006/0057787 A1 | 3/2006 | Doris .................. | 438/153 |
| 2006/0166496 A1 * | 7/2006 | Lo et al. .................. | 438/648 |
| 2006/0246740 A1 | 11/2006 | Cartier .................. | 438/778 |
| 2007/0018244 A1 | 1/2007 | Hung .................. | 257/337 |
| 2007/0148838 A1 | 6/2007 | Doris .................. | 438/197 |
| 2007/0152276 A1 | 7/2007 | Arnold .................. | 257/369 |
| 2008/0081480 A1 * | 4/2008 | Frohberg et al. .................. | 438/703 |
| 2008/0274598 A1 * | 11/2008 | Ramin et al. .................. | 438/231 |
| 2009/0008725 A1 * | 1/2009 | Guha et al. .................. | 257/411 |
| 2009/0039434 A1 * | 2/2009 | Doris et al. .................. | 257/369 |
| 2009/0039447 A1 * | 2/2009 | Copel et al. .................. | 257/411 |

OTHER PUBLICATIONS

U.S. Appl. No. 11/745,994, filed May 8, 2007, Doris.

(Continued)

*Primary Examiner*—Nathan W Ha
(74) *Attorney, Agent, or Firm*—George Sai-Halasz; Louis J. Percello

(57) ABSTRACT

FET device structures are disclosed with the PFET and NFET devices having high-k dielectric gate insulators, metal containing gates, and threshold adjusting cap layers. The NFET gate stack and the PFET gate stack each has a portion which is identical in the NFET device and in the PFET device. This identical portion contains at least a gate metal layer and a cap layer. Due to the identical portion, device fabrication is simplified, requiring a reduced number of masks. Furthermore, as a consequence of using a single layer of metal for the gates of both type of devices, the terminal electrodes of NFETs and PFETs can be butted with each other in direct physical contact. Device thresholds are further adjusted by oxygen exposure of the high-k dielectric. Threshold values are aimed for low power consumption device operation.

10 Claims, 7 Drawing Sheets

OTHER PUBLICATIONS

U.S. Appl. No. 11/682,554, filed Mar. 6, 2007, Doris.

"High speed 45 nm gate length CMOSFETs integrated into a 90nm bulk technology incorporating strain engineering" V. Chan et al., IEDM Tech. Dig., pp. 77-80, 2003.

"Dual stress liner for high performance sub-45nm gate length SOI CMOS manufacturing" H..S. Yang, et al., IEDM Tech. Dig., pp. 1075-1078, 2004.

"Role of Oxygen Vacancies in $V_{fb}/V_t$ Stability of pFET Metals on $HfO_2$," E. Cartier et al., Symp. VLSI Tech. (2005) 230-231.

V. Narayanan, et al., "Band-Edge High-Performance High-/Metal Gate n-MOSFETs using Cap Layers Containing Group IIA and IIIB Elements with Gate-First Processing for 45 nm and Beyond", Symp. VLSI Tech. (2006) 224-225.

\* cited by examiner

LOW POWER CIRCUIT STRUCTURE WITH METAL GATE AND HIGH-K DIELECTRIC

FIELD OF THE INVENTION

The present invention relates to power conserving electronic circuits. In particular, it relates to circuit structures having high-k containing gate dielectrics and metal containing gates. The invention also relates to ways of adjusting the threshold voltages for suiting low power operation.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. Among others, one such Si based material of significance for microelectronics is the silicon-germanium (SiGe) alloy. The devices in the embodiments of the present disclosure are typically part of the art of single crystal, Si based material device technology.

There is a great difficulty in maintaining performance improvements in devices of deeply submicron generations. Therefore, methods for improving performance without scaling down have become of interest. There is a promising avenue toward higher gate dielectric capacitance without having to make the gate dielectric actually thinner. This approach involves the use of so called high-k materials. The dielectric constant of such materials is significantly higher than that of $SiO_2$, which is about 3.9. A high-k material may physically be significantly thicker than oxide, and still have a lower equivalent oxide thickness (EOT) value. The EOT, a concept known in the art, refers to the thickness of such an $SiO_2$ layer which has the same capacitance per unit area as the insulator layer in question. In today state of the art FET devices, one is aiming at an EOT of below 2 nm, and preferably below 1 nm.

Device performance is also enhanced by the use of metal gates. The depletion region in the poly-Si next to the gate insulator can become an obstacle in the path to increase gate-to-channel capacitance. The solution is to use a metal gate. Metal gates also assure good conductivity along the width direction of the devices, reducing the danger of possible RC delays in the gate.

Low power consumption small FET devices are in need of precise threshold voltage control. As operating voltage decreases, to below 2V, threshold voltages also have to decrease, and threshold variation becomes less tolerable. Every new element, such as a different gate dielectric, or a different gate material, influences the threshold voltage. Sometimes such influences are detrimental for achieving the desired threshold voltage values. Any technique which can affect the threshold voltage, without other effects on the devices is a useful one. Such techniques exist, for instance by using so called cap layers, or by exposing high-k gate dielectrics to oxygen.

Unfortunately, shifting the threshold of both PFET and NFET devices simultaneously, may not easily lead to threshold values in an acceptably tight range for CMOS circuits. There is need for a structure and a technique in which the threshold of one type of device can be independently adjusted without altering the threshold of the other type of device.

Typically, small FET devices with high-k dielectrics and metal gates require expensive complicated processing. It would be useful to find ways to simplify the fabrication process, while maintaining most of the performance offered by such advanced structures. At the same time it would also be desirable to adjust thresholds for low power operation. To date, such a structure, or fabrication process does not exists.

SUMMARY OF THE INVENTION

In view of the discussed difficulties, embodiments of the present invention disclose a circuit structure which includes at least one NFET and at least one PFET device. The NFET includes an n-channel hosted in a single crystal Si based material, and an NFET gate stack overlapping the n-channel. The PFET includes a p-channel hosted in a single crystal Si based material, and a PFET gate stack overlapping the p-channel. The NFET gate stack and the PFET gate stack each has a portion which is identical in the NFET device and in the PFET device. This portion includes at least a gate metal layer and a cap layer, where the gate metal layer and the cap layer are directly interfacing with each other. The NFET device further includes an NFET gate insulator, where the NFET gate insulator further includes a layer of a first high-k material, where the layer of the first high-k material is directly interfacing with the cap layer of the NFET device. The PFET device further includes a PFET gate insulator, where the PFET gate insulator further includes a layer of a second high-k material, where the layer of the second high-k material is directly interfacing with the cap layer of the PFET device. The absolute values of the saturation thresholds of both the NFET and the PFET devices are higher than about 0.4 V.

Embodiments of the present invention further disclose a method for producing a circuit structure. The method includes: in the fabrication of an NFET, implementing an NFET gate stack, an NFET gate insulator, and an n-channel, where the n-channel is hosted in a Si based material and underlies the NFET gate insulator, where the NFET gate insulator includes a layer of a first high-k material. The method further includes: implementing a PFET gate stack, a PFET gate insulator, and a p-channel, where the p-channel is hosted in the Si based material and underlies the PFET gate insulator, where the PFET gate insulator includes a layer of a second high-k material. One overlays the first high-k material and the second high-k material with a layer of a cap material, where the first and second high-k materials are in direct physical contact with the layer of the cap material, and overlays the cap material with a layer of a gate metal, where the layer of the cap material and the layer of the gate metal are in direct physical contact. During implementation of the NFET gate stack and the PFET gate stack, producing a portion in the NFET gate stack and in the PFET gate stack by patterning the layers of the cap material and of the gate metal. This portion is identical in the NFET device and in the PFET device. The method also teaches the overlaying the NFET gate stack and a vicinity of the NFET gate stack with a first dielectric layer, and exposing the NFET device and the PFET device to oxygen. The oxygen reaches the second high-k material, and causes a predetermined shift in the threshold voltage of the PFET device, while due to the first dielectric layer oxygen is prevented from reaching the first high-k material and the NFET device threshold remains unchanged.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
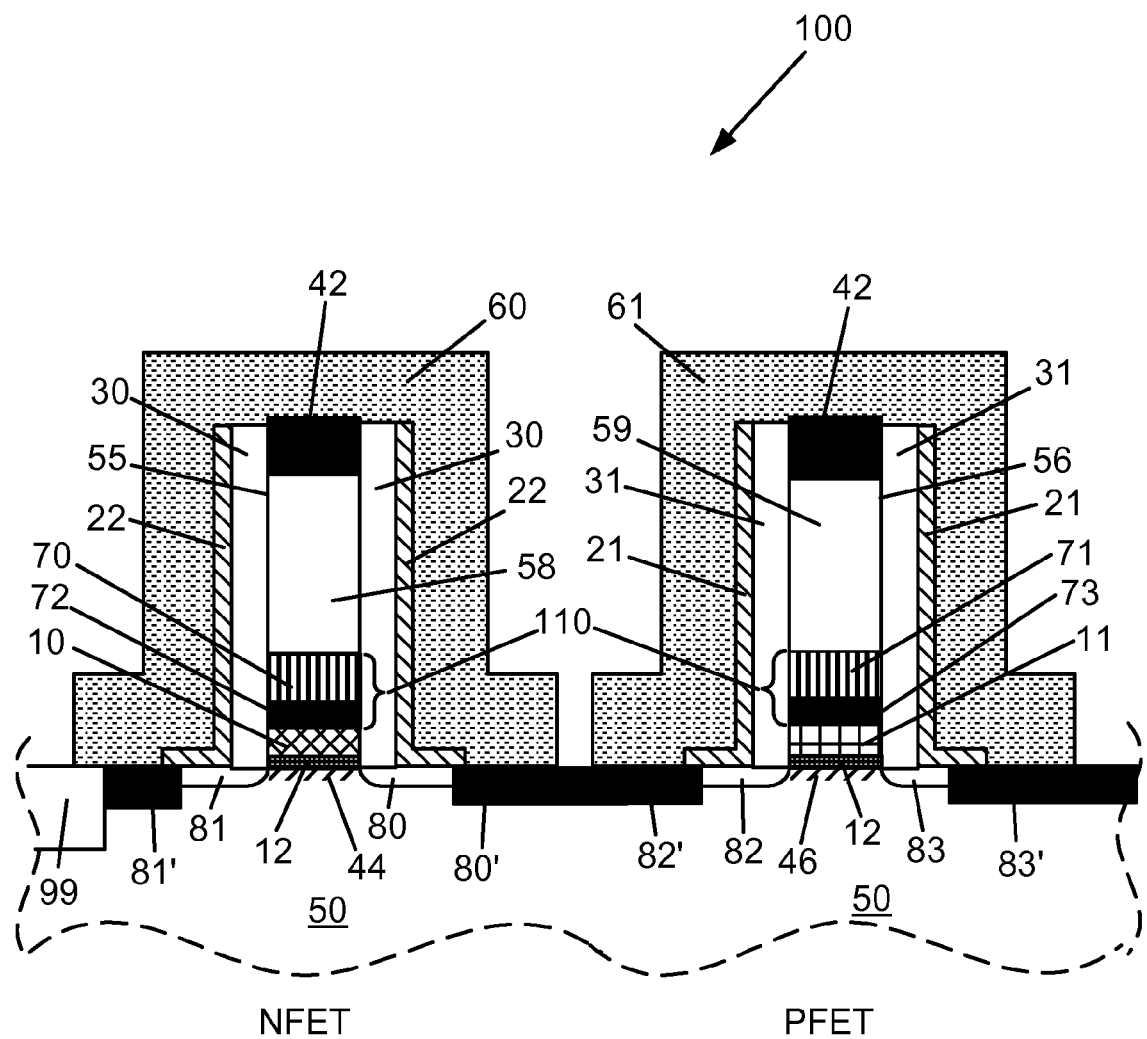
FIG. 1 shows a schematic cross section of a circuit structure according to an embodiment of the present invention, including identical gate metal layer and cap layer in both type of devices, and compressive and tensile dielectric layers.

It is understood that Field Effect Transistor-s (FET) are well known in the electronic arts. Standard components of a FET are the source, the drain, the body in-between the source and the drain, and the gate. The body is usually part of a substrate, and it is often called substrate. The gate is overlaying the body and is capable to induce a conducting channel in the body between the source and the drain. In the usual nomenclature, the channel is hosted by the body. The gate is separated from the body by the gate insulator. There are two type of FET devices: a hole conduction type, called PFET, and an electron conduction type, called NFET. Often, but not exclusively, PFET and NFET devices are wired into CMOS circuits. A CMOS circuit contains at least one PFET and at least one NFET device. In manufacturing, or processing, when NFET and PFET devices are fabricated together on the same chip, one is dealing with CMOS processing and the fabrication of CMOS structures.

In FET operation an inherent electrical attribute is the threshold voltage. When the voltage between the source and the gate exceeds the threshold voltage, the FETs are capable to carry current between the source and the drain. Since the threshold is a voltage difference between the source and the gate of the device, in general NFET threshold voltages are positive values, and PFET threshold voltages are negative values. Typically, two threshold voltages are considered in the electronic art: the low voltage threshold, and the saturation threshold. The saturation threshold, which is the threshold voltage when a high voltage is applied between the source and the drain, is lower than the low voltage threshold. Usually, at any given point in the technology's miniaturization, devices in lower powered circuits have higher thresholds and typically lower performance than the device thresholds of less power constrained higher performance circuits.

As FET devices are scaled to smaller size, the traditional way of setting threshold voltage, namely by adjusting body and channel doping, loses effectiveness. The effective workfunction of the gate material, and the gate insulator properties are becoming important factors in determining the thresholds of small FETs. Such so called small FETs have typically gate, or gate stack, lengths less than 60 nm, and operate in the range of less than about 1.7 V. The gate stack, or gate, length is defined in the direction of the device current flow, between the source and the drain. For small FETs the technology is progressing toward the use of metallic gates and high-k dielectric for gate insulators.

In small devices with low EOT gate insulators, the workfunction of the gate may significantly influence the threshold voltage. In the general terminology of the art, one characterizes the workfunction of the gate in relation to the Si energy gap. For instance, in the art the term "band-edge workfunction" means that the gate has a workfunction like that of $n^+$, or $p^+$ Si. Similarly, "mid-gap", or "quarter-gap" workfunction mean a gate appearing to have a workfunction roughly like intrinsic silicon, or one halfway between intrinsic Si and heavily doped Si. All other things being equal, with only the gate workfunction changing, the threshold difference for a small device is in the range of about 0.3 V-0.5 V for a gate workfunction going from band-edge value to mid-gap value.

The gate insulator also may influence the device threshold. Any charge present in the gate insulator, or on the interfaces of the gate insulator, does change the device threshold. Various high-k materials used in gate insulators of small devices do have effects on the device threshold. It is know that exposing a gate dielectric which comprises a high-k material to oxygen, may result in shifting device thresholds in a direction which is the same as if one moved the gate workfunction toward the $p^+$ silicon workfunction. This results in lowering the PFET device threshold, namely, making it a smaller negative voltage, and raising the NFET device threshold, namely making it a larger positive voltage. From the way the device thresholds behave, oxygen exposure of the high-k material results in rendering the high-k material more negative relative to its state before the oxygen exposure. This may mean actual accumulation of a net negative charge, or possibly the decreasing of an already present positive charge. In either case, the net charge concentration of the high-k material, which would include possible charges on the interfaces of the material, shifts toward the negative direction due to the oxygen exposure. Such threshold shifts due to oxygen diffusion to high-k gate dielectrics have been reported in the art, for instance: "2005 Symposium on VLSI Technology Digest of Technical Papers", Pg. 230, by E. Cartier.

It is preferable to carry out such an oxygen exposure at relatively low temperatures, and it is also preferable that no high temperature processing should occur afterwards. Accordingly, such a threshold shifting operation should occur late in the device fabrication, typically after the source and the drain have been activated. This requirement means that one has to expose the high-k material in the gate dielectric at a point in the fabrication process when substantially most of the processing has already been carried out, for instance, the gate, and gate sidewalls are all in place, and the gate insulator is shielded under possibly several layers of various materials. However, there may be a path for the oxygen to reach from the environs to the gate insulator. This path is through oxide, $SiO_2$, based materials, or directly and laterally through the high-k material itself. Oxide typically is the material of liners. Liners are thin insulating layers which are deposited conformally essentially over all of the structures, in particular over the gates and the source/drain regions. Use of liners is standard practice in CMOS processing. From the point of view of adjusting the threshold of the device, the property of interest is that the liner would be penetrable by oxygen. Indeed, as referenced earlier, such threshold shifts due to oxygen diffusion through liners, are known in the art. Additional layers that may separate a gate insulator from the environment after the source and the drain have already been fabricated, are so called offset spacers. As known in the art, offset spacers are usually on the side of the gate, fulfilling the same role for source/drain extension and halo implants, as the regular spacers fulfill in respect to the deeper portions of the source/drain junctions. Offset spacers may typically also be fabricated from oxide. Consequently, if a FET is exposed to oxygen, when a liner and an offset spacer are covering the gate, the oxygen may reach the gate insulator within a short time, measured in minutes our hours. However, in any given particular embodiment of FET fabrication there may be further layers, or fewer layers, covering the gate after the source/drain fabrication, but as long as they do not block oxygen, they are not forming an obstacle to adjusting the threshold by oxygen exposure.

It would be preferable if the thresholds of the different types of devices could be adjusted individually, meaning, one would desire to use threshold tuning techniques, such as the oxygen exposure, in a manner that the threshold of one type device becomes shifted without affecting the threshold of the other type of device. Embodiments of the present invention teach such a selective adjusting of a device threshold by having oxygen diffusing to the gate dielectric of one type of FET, while the other type of FET is not affected. The device not to be affected by the oxygen exposure is covered by a dielectric layer which does not permit oxygen penetration. Such an oxygen blocking dielectric layer may be of nitride (SiN). In embodiments of the present invention the nitride layer is not only used to block oxygen, but it is deposited in such conditions that it is in a stressed state, and it imparts this stressed state onto the channel of the FET. This stress in the channel results in higher device performance. After the oxygen exposure, the device with the changed threshold also receives an appropriately stressed dielectric layer mainly in order to improve its performance.

Some metals, or metallic materials suitable for gate metals, for instance W, under standard deposition circumstances behave as mid-gap workfunction materials. It was studied and observed that sandwiching a so called cap layer between the high-k material of the gate insulator and the gate metal, and with proper treatment, the effective workfunction of the gate metal can be shifted toward the $n^+$ Si band-edge value. The effect of such cap layers has been already reported in the art, see for instance, by V. Narayanan et al in "IEEE VLSI Symposium", p. 224, (2006), and by Guha et al. in Appl. Phys. Lett. 90, 092902 (2007).

The behavior of the metal workfunction, and that of the high-k material allows one to fabricate a complex circuit structure, containing both NFET and PFET devices, with an extremely simple process, which process may yield low power, but high density, and relatively high performance circuits. Simplicity in a process means cost savings, both because of the less cumbersome process, and due to a presumably higher yield. Low power, is an important characteristic, since the art is approaching the limits of the system cooling capacity due to circuit power consumption.

Embodiments of the present invention achieve simplicity by fabricating the gate metal layers and the cap layers for both type of devices from uniformly deposited common layers. In this manner large number of masking and processing steps are saved, in comparison with the usual procedures in the art where he fabrication of the two type of devices is not compatible, and where while processing one of the device types the other type has to be masked. Furthermore, in representative embodiments of the present invention the gate insulator, including the high-k material, is also commonly processed for both type of devices using blanket layers of the gate dielectrics.

FIG. 1 shows a schematic cross section of a circuit structure 100 according to an embodiment of the present invention, including identical gate metal layer and cap layer in both type of devices, and compressive and tensile dielectric layers. The figure depicts two devices, an NFET and a PFET, of the at least one NFET and PFET device that make up the circuit structure, typically a CMOS structure.

It is understood that in addition to the elements of the embodiments of the invention, the figures show several other elements since they are standard components of FET devices. The device bodies 50 are of a Si based material, typically of a single crystal. In a representative embodiment of the invention the Si based material bodies 50 are essentially Si. In exemplary embodiments of the invention the device bodies 50 are part of a substrate. The substrate may be any type known in the electronic art, such as bulk, or semiconductor on insulator (SOI), fully depleted, or partially depleted, FIN type, or any other kind. The bodies 50 are hosting, respectively, an n-channel 44 and a p-channel 46 for the two type of devices. Substrates, or bodies 50, may have various wells of various conductivity types, in various nested positioning enclosing device bodies. These, as many other nuances are not displayed, or discussed further, as having no particular significance for embodiments of the present disclosure. The figure shows what typically may be only a small fraction of an electronic chip, for instance a processor, as indicated by the wavy dashed line boundaries. Typically the devices have silicide 42 at the top of the gate stacks 55, 56. As one skilled in the art would know, these elements all have their individual characteristics. Accordingly, when common indicators numbers are used in the figures of the present disclosure, it is because from the point of view of embodiments of the present invention the individual characteristics of such elements having no particular significance.

The devices have standard sidewall offset spacers 30, 31. For embodiments of the present invention the offset spacer material is of significance only to the extent that the offset spacer 31 pertaining to the PFET device, the one which had its threshold adjusted by oxygen exposure, is preferably penetrable to oxygen. The typical material used in the art for such spacers is oxide, satisfying the oxygen penetrability requirement. Typically the spacer of the NFET device 30 and the spacer of the PFET device 31 are fabricated during the same processing steps, and are of the same material. However, for representative embodiments of the present invention the offset spacers 30, 31 are not essential, and may not be employed at all, or may be removed before the structures are finalized.

The devices also show liners 21, 22 as known in the art. Such liners are regularly used in standard CMOS processing. The material of such liners is an oxide, typically silicon-dioxide ($SiO_2$). The traditional role for the liners is in the protection of the gate stacks 55, 56 and the source/drain structure regions during various processing steps, particularly during etching steps. Such liners typically have selective etching properties relative to nitride layers and silicon. The material of the PFET liner 21, typically $SiO_2$, allows oxygen diffusion, affording oxygen to reach the gate dielectric 11. When oxygen reaches the gate insulator 11, it can shift the threshold voltage of the PFET by a desired, predetermined amount.

Both the NFET gate stack and the PFET gate stack has a portion 110 which is identical in the NFET device and in the PFET device. This portion 110 contains in each device at least a gate metal layer 70 in the NFET device and 71 in the PFET device, and a cap layer 72 in the NFET device and 73 in the PFET device. In the NFET device the gate metal layer 70 and the cap layer 72 are directly interfacing, and in the same manner, in the PFET device the gate metal layer 71 and the cap layer 73 are also directly interfacing.

Portion 110 in both gate stacks 55, 56 being identical, entails that the material in gate metal layers 70, 71 is the same, and separately, that the material in the cap layers 72, 73 is the same, as well. In embodiments of the present invention the material of the gate metal layers may be selected from the group consisting of W, Mo, Mn, Ta, TaN, TiN, WN, Ru, Cr, Ta, Nb, V, Mn, Re, and their admixtures. For reasons of setting thresholds to the desired range, typically those metals that can be deposited with a roughly mid-gap to quarter-gap, work-function, such as W and TiN, are selected in representative embodiments. Typically the gate metal layers 70, 71 in both devices are composed essentially of TiN. In embodiments of the present invention the material of the cap layers 72, 73 may contain materials form Group IIA and/or Group IIIB of the periodic table. In representative embodiments of the invention the cap layers 72, 73 may contain lanthanum (La).

The NFET device further has an NFET gate insulator. The NFET gate insulator includes a layer of a first high-k material 10. This layer of first high-k material 10 directly interfaces with the cap layer 72 in the NFET device. The PFET device further has a PFET gate insulator. The PFET gate insulator includes a layer of a second high-k material 11. This layer of second high-k material 11 directly interfaces with the cap layer 73 in the PFET device.

As it is known in the art, the common property of high-k gate dielectrics is the possession of a larger dielectric constant than that of the standard oxide ($SiO_2$) gate insulator material, which has a value of approximately 3.9. FIG. 1 shows an embodiment when the layers of the first and second high-k materials 10, 11 are of a different kind. In embodiments of the present invention the first and second layers of high-k materials 10, 11 may be $ZrO_2$, $HfO_2$, $Al_2O_3$, HfSiO, HfSiON, and/or their admixtures. Equally, the embodiments of the present invention may be such that the first and second high-k materials 10, 11 are of a same, common material. In a typical embodiment of the invention a common high-k material that may be present in both gate insulators 10, 11 is essentially $HfO_2$.

Each gate insulator besides the high-k dielectric layers 10, 11 may have other components, as well. Often in embodiments of the present invention a very thin, less than about 1 nm, chemically formed oxide layer 12 may be present between the first and second high-k dielectric layers, 10, 11 and the device body 50. However, any and all inner structure, or the lack of any structure beyond simply containing a high-k dielectric, for either the NFET or the PFET gate insulators is within the scope of the embodiments of the present invention. In exemplary embodiments of the present invention, $HfO_2$ would be used for both the first and the second high-k dielectric layer, 10, 11 and the $HfO_2$ would be covering a thin chemical $SiO_2$ layer 12. The EOT of such a gate insulator may be between about 0.4 nm to 1.2 nm.

The NFET gate stack 55 and the PFET gate stack 56 in typical embodiments of the present invention are multilayered structures. Besides the discussed common identical portion 110, they would usually include silicon portions 58, 59 in polycrystalline and possibly also in amorphous forms. The top of the gate stacks usually consist of silicide layers 42. Any, and all such multilayered structures complementing the common identical portion 110 are included in the scope of the present invention.

As the consequence of the two type of devices having the common identical portion 110, which was patterned from commonly deposited layers, the circuit structure 100 may be implemented with butted electrodes, or junctions. The term "butted junction" is well known in the electronic arts, it means that two electrodes, such as the source/drain junctions from adjacent PFET and NFET devices, are disposed side by side in direct physical contact, without isolation region between them. Without the isolation regions the circuit density can be higher than with isolation regions, since less chip area is used up by the isolation structures.

An alternate term for source and drain junctions are source and drain electrodes, expressing the electrical connection between the channel and the source and the drain. Also, in deeply submicron generations of FETs, the source/drain junctions and the body of the classical FETs, namely $n^+$ regions forming a junction with a p-type device body for NFET, and $p^+$ region forming a junction with an n-type device body, are undergoing a myriad of changes and may not resemble textbook cases. Embodiments of the present invention are not limited by any particular realization of the NFET and PFET electrodes. Any an all variations, from all metallic Shottky barrier electrodes, to the above exemplified classical junctions, to electrodes penetrating down to buried insulating layers, and odd shaped structures belonging to various FIN device bodies, are all within the scope of embodiments of the present invention. The shape and actual realization of the electrodes is not significant.

FIG. 1 displays, without limiting the general scope, an electrode arrangement often used in FET devices. In the figure, the silicided regions, shown in dark, penetrate deeper than the doped regions, again a typical arrangement in FETs, and shown without the intent of limitation. For all electrodes, for both sources and drains, and for both NFET and PFET devices, if the doped part of the electrodes are given certain indicator numbers, then the silicided part of the same electrodes are given the same numbers primed, for instance, 83 and 83' for one of the PFET electrodes.

The NFET electrodes 80 and 80' and 81 and 81', including a first electrode 80, 80', are adjoining the n-channel 44, and are capable of being in electrical continuity with the n-channel 44. PFET electrodes 82 and 82' and 83 and 83', including a second electrode 82, 82', are adjoining the p-channel 46, and are capable of being in electrical continuity with the p-channel 46. Electrical current can flow between the electrodes of either of the devices, through the respective channel, when the source to gate voltage exceeds the threshold voltage value. As shown in the figure, the sides of the electrodes facing away from the channel are butted. The first electrode 80, 80' and the second electrode 82, 82' are butted against one another in direct physical contact. If desired, isolation structures, of course, can be introduced between devices. The presented fabrication method allows the butting of electrodes, it does not necessarily requires it. As illustrated, for instance the NFET junction 81, 81' is not butted against another junction, but is confined by an isolation structure 99, shown as an oxide shallow trench scheme, known in the art. More detailed presentation of butted junctions for short FET devices with high-k dielectrics and metal gates is given in U.S. patent application Ser. No. 11/745,994, filed on May 8, 2007, titled: "Devices with Metal Gate, High-k Dielectric, and Butted Electrodes", incorporated herein by reference.

FIG. 1 further shows the presence of a first dielectric layer 60 overlaying the NFET gate stack 55 and the vicinity of the NFET gate stack. The first dielectric layer 60 and the n-channel 44 are in a tensile stress, the tensile stress is being imparted by the first dielectric layer 60 onto the n-channel 44. Similarly, a second dielectric layer 61 is overlaying the PFET gate stack 56 and the vicinity of the PFET gate stack. The second dielectric layer 61 and the p-channel 46 are in a compressive stress, the compressive stress is being imparted by the second dielectric layer 61 onto the p-channel 46. The term vicinity indicates that the gate stacks 55, 56 are fully, or partially, surrounded by the stressed dielectric layers. The vicinity of the stacks 55, 56 may include the source/drain regions 80, 80', 81, 81', 82, 82', 83, 83', and possibly include isolation structures 99, and the Si body material 50.

Inducing stress of a desirable kind in channels of FET devices by the use of stressed dielectric layers has been known in the art. The properties of charge transport in Si based materials is such that FET performance improves if an n-channel is under tensile stress, and a p-channel is under compressive stress. As discussed above, in typical embodiments of the present invention this performance enhancing pattern is followed.

In exemplary embodiments of the present invention both the first 60 and the second 61 dielectric layers are essentially nitride (SiN) layers, which can be deposited as either under compressive, or under tensile stress. The thickness of the stressed nitride layers are usually about between 20 nm and 150 nm.

The absolute values of the saturation thresholds of the NFET and the PFET devices are higher than about 0.4 V, which values assure low power consumption. The desired, and roughly symmetric—meaning about equal in absolute size—threshold values are arrived at after purposeful processing.

Following customary terminology, the discussion of the PFET thresholds are at times referred to without the term "absolute value", or shown with an explicit negative sign. It is understood, however that PFET thresholds have negative voltage values. After the forming, and the patterning of the gate stacks, the thresholds are at about mid-gap values, in the range of about 0.5 V-0.7 V. Upon processing the cap layers 72, 73 both thresholds shift in the direction of an n-type Si gap value, entailing the lowering of the NFET device threshold, and a raising of the PFET device threshold. However, exposing to oxygen only the second high-k dielectric 11 of the PFET gate stack, shifts the PFET device threshold toward a p-type Si gap value, namely lowering the PFET device threshold, while leaving the NFET device threshold unchanged. With the right tuning of the processes one may reach roughly quarter-gap threshold values for both type of devices. See, for instance: "2005 Symposium on VLSI Technology Digest of Technical Papers, Pg. 230, by E. Cartier", and "V. Narayanan et al in "IEEE VLSI Symposium", p. 224, (2006)" both publications incorporated herein by reference. In typical embodiment of the present invention the absolute values of the saturation thresholds of the NFET and the PFET devices are between about 0.40 V and about 0.65 V.

The layer of the first high-k material 10 has a first concentration of charges and the layer of the second high-k material 11 has a second concentration of charges, which concentrations include possible charges on the interfaces of the high-k materials. Having lowered the threshold of the PFET device, the second concentration is more negative, namely is shifted in the negative direction in comparison to the first concentration. This shift indicates a history of oxygen exposure of the layer of the second high-k material 11.

It is understood that FIG. 1, as all figures, is only a schematic representation. As known in the art, there may be many more, or less, elements in the structures than presented in the figures, but these would not affect the scope of the embodiments of the present invention.

Further discussions and figures may present only those processing steps which are relevant in yielding the structure of FIG. 1. Manufacturing of NFET, PFET, and CMOS is very well established in the art. It is understood that there are a large number of steps involved in such processing, and each step might have practically endless variations known to those skilled in the art. It is further understood that the whole range of known processing techniques are available for fabricating the disclosed device structures, and only those process steps will be detailed that are related to embodiments of the present invention.

Figure 2:
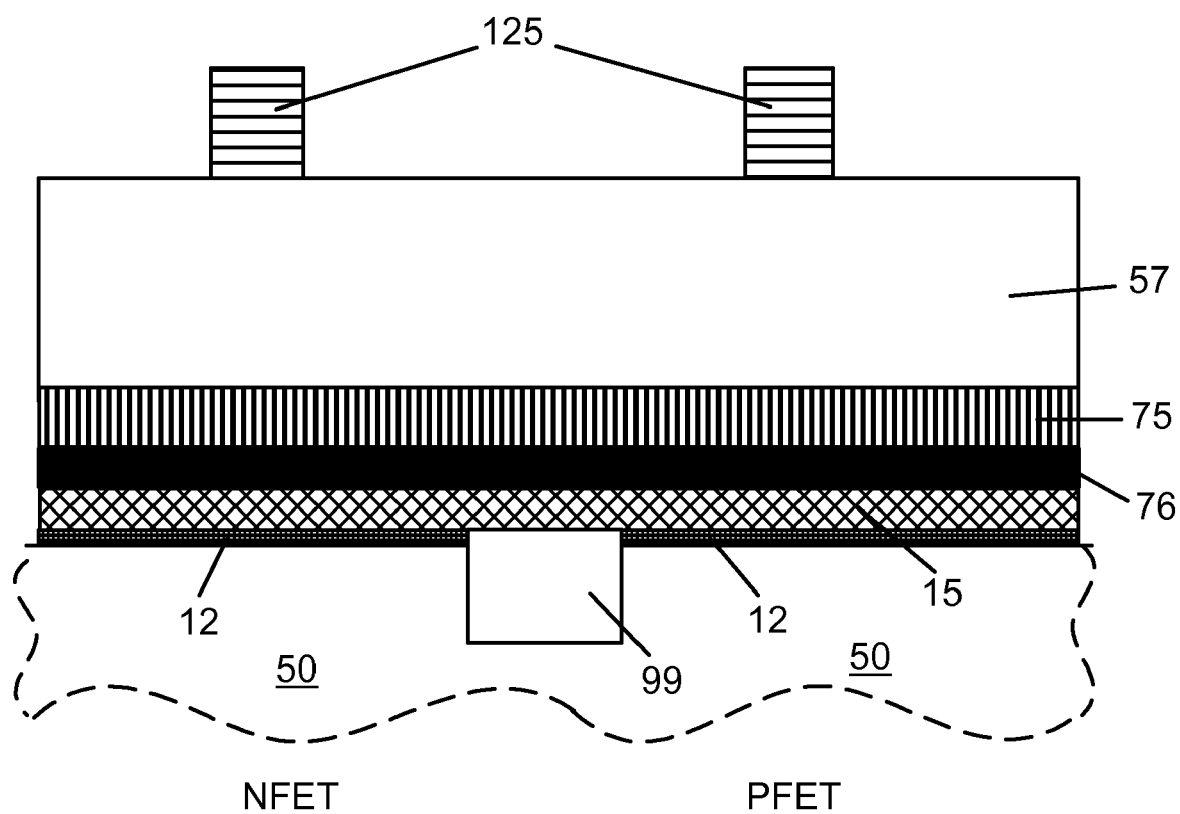
FIG. 2 shows a schematic cross section of a stage in the processing where various layers, including layers common in both type of devices, have been deposited.

FIG. 2 shows a schematic cross section of a stage in the processing where various layers, including common layers, have already been deposited. This figure shows a variation on the embodiment depicted on FIG. 1. Instead of butted junctions, it shows the already discussed embodiment when an isolation structure 99 is between the future place of the first electrode 80, 80' and the second electrode 82, 82'. As also presented in representative embodiments earlier, in this figure the first high-k material 10 and the second high-k material 11 are patterned from a commonly deposited identical high-k material layer 15. The thin chemical oxide layer 12 interfaces between the bodies 50 and the identical material layer 15.

FIG. 2 also shows that the high-k material layer 15 is overlaid with a layer of a cap material 76 in a manner that the identical high-k material layer 15 is in direct physical contact with the layer of the cap material 76. If in an alternate embodiment the high-k material would not be identical for both type of devices, the layer of the cap material 76 would similarly overlay differing layers of a first and second high-k material. The cap material layer 76 is overlaid with a gate metal layer 75, in a manner that the layer of the cap material 76 and the a gate metal layer 75 are in direct physical contact.

The metal 75 layer may be covered with further material layers, typically, but not necessarily of polycrystalline and/or amorphous Si, that will be part of the gate stacks 55, 56 after patterning. Details of such layers are not significant for the embodiments of the present invention and they are shown lumped together 57.

During the forming of all these layers: the thin oxide 12, the high-k dielectric 15, the cap 76, the gate metal 75, and the additional ones 57, the use of not even a single mask may have been necessary. All these layers have been blanket formed, or disposed, over the regions of both the PFET devices and the NFET devices. Finally, FIG. 2 shows that in preparation for patterning of the gate stacks, masking layers 125 as know in the art, have been formed, as well.

Figure 3:
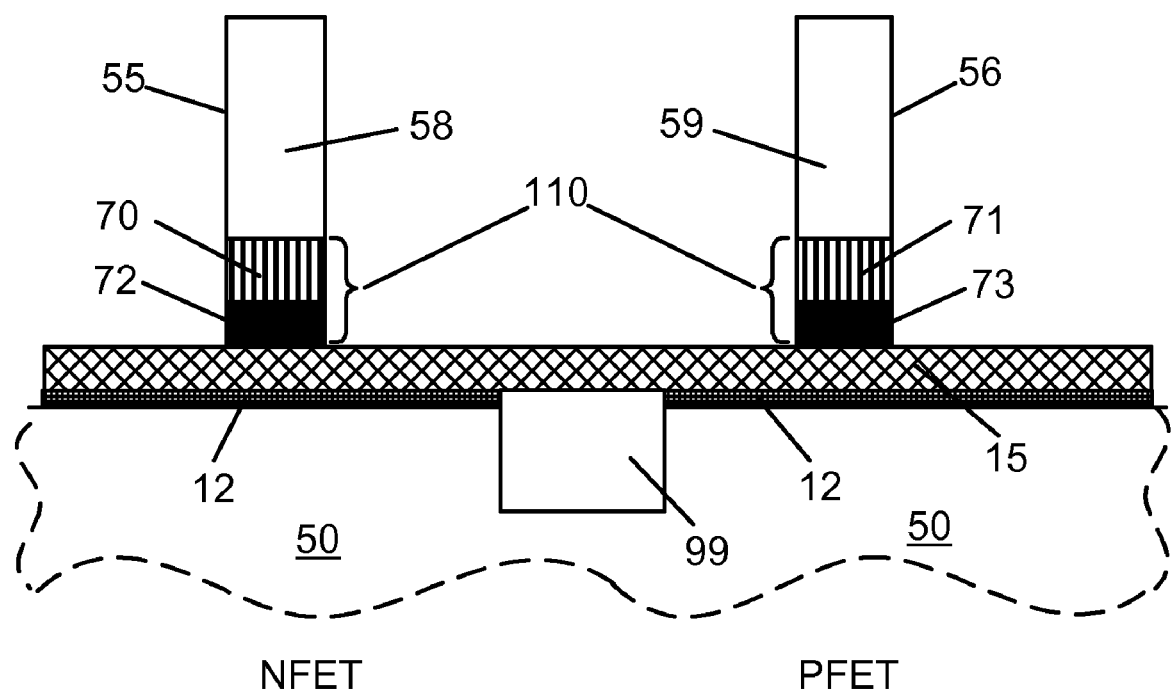
FIG. 3 shows a schematic cross section of a stage in the processing after gate patterning.

FIG. 3 shows a schematic cross section of a stage in the processing after gate patterning. The gate stacks 55, 56 have been created by etching methods know in the art. As shown, the high-k dielectric layer and the thin oxide layer 12 are still in place. As one skilled in the art may know, there are several possibilities for dealing with such layers. They may be etched together with the gate stacks, or etched later, or possibly left in place. All such eventualities are included in the scope of the present invention. FIG. 3 shows the result of the patterning of the cap material layer 76 and of the gate metal layer 75, with the result of having produced the portion 110 which is identical in the NFET device and in the PFET device. These layers may be covered with further material layers, typically, but not necessarily of polycrystalline and/or amorphous Si, that will be part of the gate stacks 55, 56 after patterning. Details of such layers are not significant for the embodiments of the present invention and they are shown lumped together 57.

Figure 4:
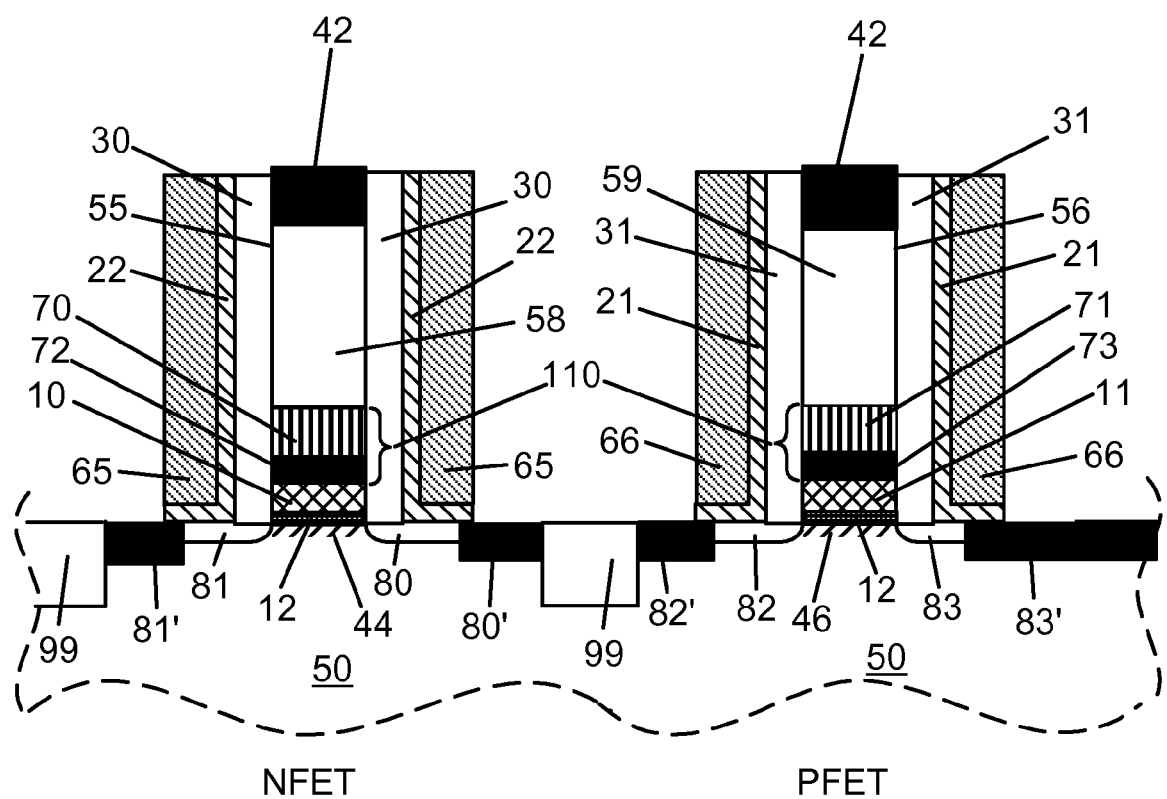
FIG. 4 shows a schematic cross section of a state of the processing for embodiments of the present invention where gate stacks and electrodes have already been formed.

FIG. 4 shows a schematic cross section of a state of the processing for embodiments of the present invention where gate stacks and electrodes have already been formed. Following the patterning of the gate stacks 55, 56 the NFET and PFET devices have reached the depicted stage in the fabrication by the use of processing steps known in the art. Spacers 65, 66 are shown because they are elements, as know in the art, involved in source/drain fabrication and the silicidation of electrodes, 80', 81', 82', 83' and of the gates 42. The spacers 65, 66 typically are made of nitride. The threshold of the NFET device has been decreased and the threshold of the PFET device increased with the help of the cap layers 72, 73 in the identical portions 110. With this shift in the thresholds, at this stage in the processing, the NFET device thresholds is essentially set, and it is not intended to change further.

The electrodes of the devices have already been through a high thermal budget process. In FET processing, typically the largest temperature budgets, meaning temperature and time exposure combinations, are reached during source/drain electrodes fabrication. Since the sources and drains have already been fabricated, the structure of FIG. 4 has already received such high temperature fabrication steps, and the structure will not have to be exposed to a further large temperature budget treatment. From the perspective of embodiments of the present invention, exposure to a high temperature budget means a comparable heat treatment as the one used in the source/drain fabrication.

Figure 5:
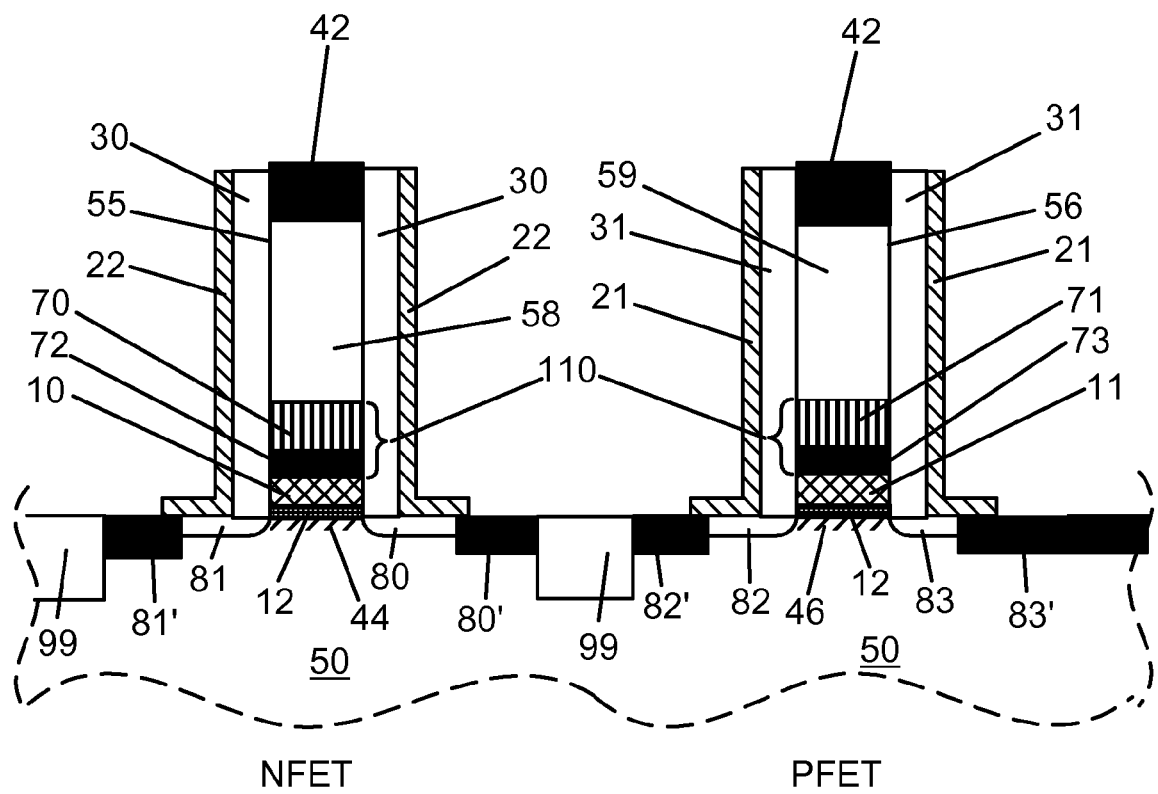
FIG. 5 shows a schematic cross section of a following stage in the processing of embodiments of the present invention where spacers have been removed.

FIG. 5 shows a schematic cross section of a following stage in the processing of embodiments of the present invention where spacers have been removed. In standard FET fabrication the spacers 65, 66 would remain in place through the many following processing steps. In embodiments of the present invention, however, the final threshold adjustment by oxygen exposure of the PFET device is yet to be done. The spacer for the PFET device 66, which is made of nitride, would block oxygen penetration to the high-k material of the gate dielectric 11. Accordingly, the spacer of the PFET device may have to be removed. The spacer of the NFET device 65 could stay in place as a barrier against oxygen penetration. However, in representative embodiments of the present invention the NFET device spacer 65 is also removed, to be replaced with a dielectric layer which is preferably under appropriate stress. In representative embodiments of the present invention the dual roles of protecting the high-k dielectric 10 of the NFET device, and of providing stress for higher performance, may be combined into one. Accordingly, usually, but necessarily, both spacers 65, 66 are being removed. The removal is done by etching in manners known in the art. For instance, glycerated buffered hydrofluoric acid with ratios of 5:1:1.6 etches nitride selectively versus silicon, oxide, and metal, which materials may be exposed on the wafer surface while the nitride is being etched.

Figure 6:
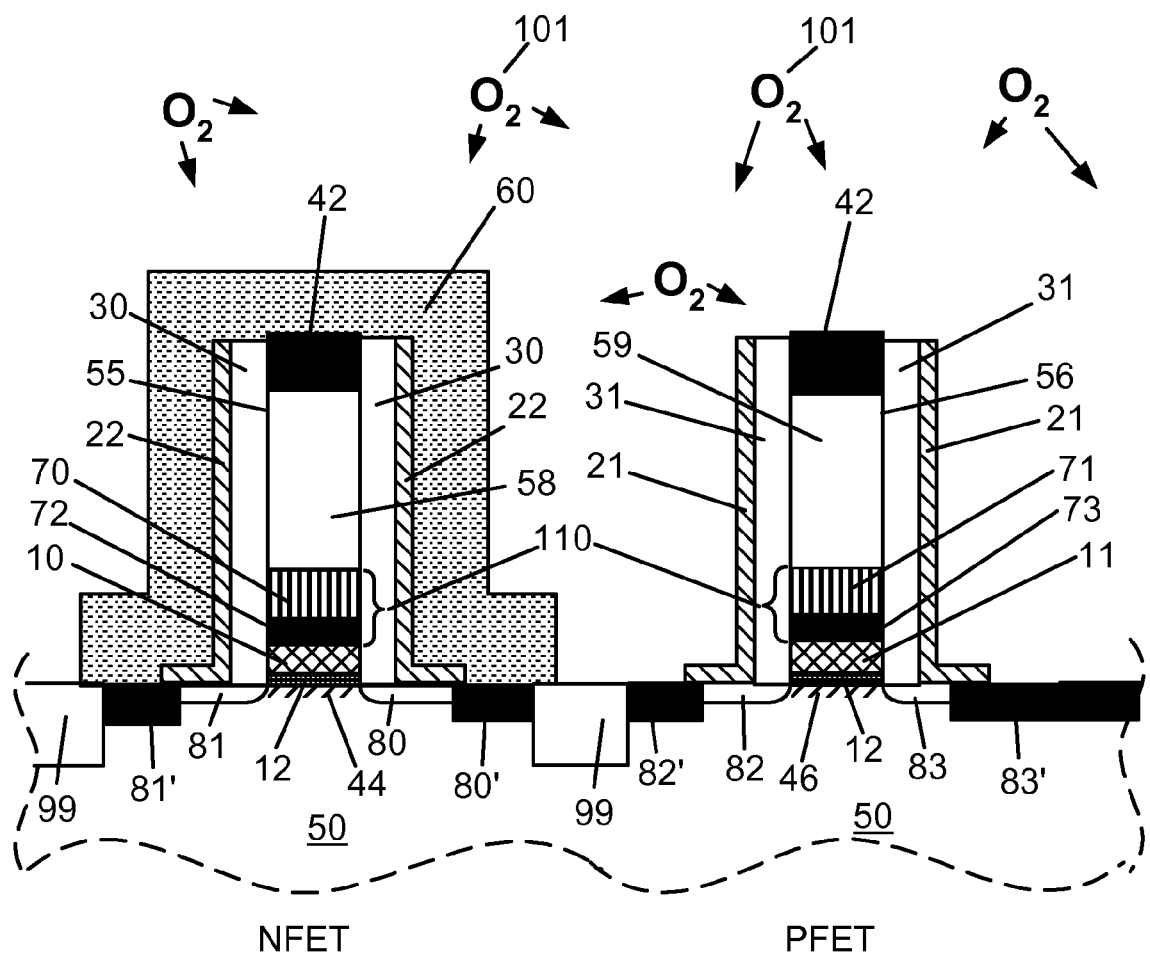
FIG. 6 shows a schematic cross section of a stage in the processing of embodiments of the present invention where an oxygen blocking stressed dielectric layer is overlaying the NFET device, and the circuit structure is exposed to oxygen.

FIG. 6 shows a schematic cross section of a stage in the processing of embodiments of the present invention where an oxygen blocking stressed dielectric layer 60 is overlaying the NFET device, and the circuit structure is exposed to oxygen 101. After the application of proper blocking masks, as known in the art, the NFET device is overlaid by a first dielectric layer 60 covering the first gate stack 55 and the vicinity of the NFET gate stack. The first dielectric layer 60 and the n-channel 44 are in tensile stress, which tensile stress is imparted by the first dielectric layer 60 onto the n-channel 44. Also, the first dielectric layer 60 is so selected to be a blocker against oxygen penetration. In typical embodiments of the present invention the first dielectric layer 60 is a nitride (SiN) layer. FIG. 6 shows the step of oxygen exposure 101, as well. This exposure may occur at low temperature at about 200° C. to 350° C. by furnace or rapid thermal anneal. The duration of the oxygen exposure 101 may vary broadly from approximately 2 minutes to about 150 minutes. For the duration of the exposure oxygen is blocked by the first dielectric layer 60 from penetrating to the layer of the first high-k material 10 of the NFET device, but oxygen is capable of penetrating to the layer of the second high-k material 11 of the PFET device. In the embodiment shown in FIG. 6 the first and second layers of the high-k material 10, 11 are of an identical material, typically $HfO_2$. The amount of threshold shift for the PFET device depends on the oxygen exposure parameters, primarily on the temperature and duration of the procedure. In exemplary embodiments of the present invention the size of the threshold shift is so selected that the final PFET device threshold corresponds also to an approximately quarter-gap value workfunction gate. In representative embodiments of the present invention the absolute values of the saturation thresholds of the NFET and the PFET devices are between about 0.40 V and about 0.65 V.

After the oxygen exposure step, the PFET device is overlaid with a second dielectric layer 61, in compressive stress, which is imparted to the p-channel 46. This second dielectric layer 61 may be laid down in a conformal or a non-conformal manner. In exemplary embodiments of the present invention the second dielectric layer 61 is a nitride (SiN) layer. Stressed dielectric layers and their implementation by SiN is discussed in more detail in U.S. patent application Ser. No. 11/682,554, filed on Mar. 6, 2007, titled: "Enhanced Transistor Performance by Non-Conformal Stressed Layers", incorporated herein by reference. With the second dielectric layer 61 in place, one arrives to the structure displayed and discussed in reference to FIG. 1.

The circuit structure, and its wiring, may be completed with standard steps known to one skilled in the art.

Figure 7:
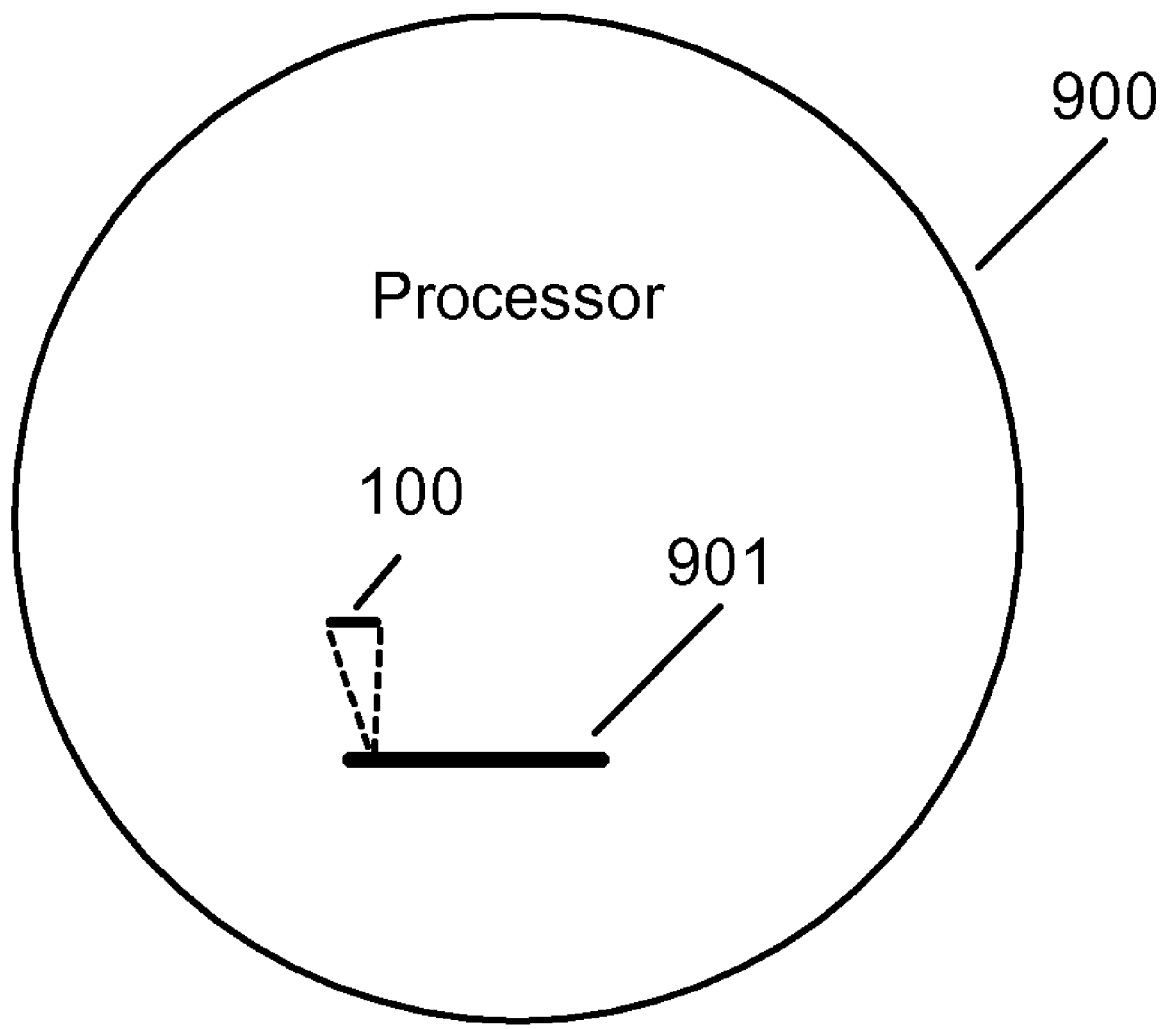
FIG. 7 shows a symbolic view of a processor containing at least one circuit structure according to an embodiment of the present invention.

FIG. 7 shows a symbolic view of a processor containing at least one CMOS circuit according to an embodiment of the present invention. Such a processor 900 has at least one chip 901, which contains at least one circuit structure 100, with at least one NFET and one PFET having high-k gate dielectrics, gate stacks comprising a common identical portion having at least a gate metal, a cap layer. The saturation thresholds of the FETs are optimized for low power consumption, in absolute values being above approximately 0.4 V. The processor 900 may be any processor which can benefit from embodiments of the present invention, which yields high performance at low power. Representative embodiments of processors manufactured with embodiments of the disclosed structure are digital processors, typically found in the central processing complex of computers; mixed digital/analog processors, typically found in communication equipment; and others.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A circuit structure, comprising:

at least one NFET device, said NFET device comprises an n-channel hosted in a Si based material, and an NFET gate stack overlapping said n-channel;

at least one PFET device, said PFET device comprises a p-channel hosted in said Si based material, and a PFET gate stack overlapping said p-channel;

wherein said NFET gate stack and said PFET gate stack each has a portion which is identical in said NFET device and in said PFET device, wherein said portion comprises at least a gate metal layer and a cap layer, wherein said gate metal layer and said cap layer are directly interfacing with each other;

wherein said NFET device further comprises an NFET gate insulator, wherein said NFET gate insulator comprises a layer of a first high-k material, wherein said layer of said first high-k material directly interfaces with said cap layer in said NFET device;

wherein said PFET device further comprises a PFET gate insulator, wherein said PFET gate insulator comprises a layer of a second high-k material, wherein said layer of said second high-k material directly interfaces with said cap layer in said PFET device; and wherein absolute values of the saturation thresholds of said NFET and said PFET devices are higher than about 0.4 V.

2. The circuit structure of claim 1, further comprising:

a first dielectric layer overlaying said NFET gate stack and a vicinity of said NFET gate stack, wherein said first dielectric layer and said n-channel are in a tensile stress, wherein said tensile stress is imparted by said first dielectric layer onto said n-channel; and a second dielectric layer overlaying said PFET gate stack and a vicinity of said PFET gate stack, wherein said second dielectric layer and said p-channel are in a compressive stress, wherein said compressive stress is imparted by said second dielectric layer onto said p-channel.

3. The circuit structure of claim 2, wherein said first dielectric layer and said second dielectric layer are both composed essentially of SiN.

4. The circuit structure of claim 1, wherein said gate metal layer is selected from the group consisting of W, Mo, Mn, Ta, TaN, TiN, WN, Ru, Cr, Ta, Nb, V, Mn, Re, and their admixtures.

5. The circuit structure of claim 4, wherein said gate metal layer is composed essentially of TiN, and said cap layer comprises lanthanum (La).

6. The circuit structure of claim 1, wherein said layer of said first high-k material has a first concentration of charges and said layer of said second high-k material has a second concentration of charges, wherein said second concentration is more negative than said first concentration, whereby indicating a history of oxygen exposure of said layer of said second high-k material.

7. The circuit structure of claim 6, wherein said first high-k material and said second high-k material are both essentially of $HfO_2$.

8. The circuit structure of claim 1, wherein said absolute values of the saturation thresholds of said NFET and said PFET devices are between about 0.45 V and about 0.65 V.

9. The circuit structure of claim 1, wherein said NFET device further comprises NFET electrodes, including a first electrode, wherein said NFET electrodes adjoin said n-channel and are capable of being in electrical continuity with said n-channel, and wherein said PFET device further comprises PFET electrodes, including a second electrode, wherein said PFET electrodes adjoin said p-channel and are capable of being in electrical continuity with said p-channel, and wherein said first electrode and said second electrode are butted against one another in direct physical contact.

10. The circuit structure of claim 1, wherein said circuit structure is characterized as being a CMOS structure.

* * * * *